(12) United States Patent
Nishizawa

(10) Patent No.: US 7,612,419 B2
(45) Date of Patent: Nov. 3, 2009

(54) WAFER, SEMICONDUCTOR CHIP, AND SEMICONDUCTOR DEVICE

(75) Inventor: Kazuyuki Nishizawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 124 days.

(21) Appl. No.: 11/071,281

(22) Filed: Mar. 4, 2005

(65) Prior Publication Data

US 2005/0212092 A1 Sep. 29, 2005

(30) Foreign Application Priority Data

Mar. 26, 2004 (JP) ............................. 2004-092251

(51) Int. Cl.
*H01L 27/10* (2006.01)
(52) U.S. Cl. .............................. 257/401; 257/E23.179; 438/462
(58) Field of Classification Search ................. 438/460, 438/462, 463; 257/401, E23.179
See application file for complete search history.

(56) References Cited

U.S. PATENT DOCUMENTS 6,713,843 B2 * 3/2004 Fu ............................. 257/620
2001/0052789 A1 * 12/2001 Gerstmeier et al. ......... 324/765
2003/0140514 A1 * 7/2003 Fu ............................... 33/645

FOREIGN PATENT DOCUMENTS

JP  2003-258049  9/2003

* cited by examiner

*Primary Examiner*—Jerome Jackson, Jr.
*Assistant Examiner*—Paul A Budd
(74) *Attorney, Agent, or Firm*—Foley & Lardner LLP

(57) ABSTRACT

Scribe lines demarcating semiconductor chips comprise, in both the vertical direction and the horizontal direction, first-type scribe lines of the minimum width enabling cutting by dicing or other means, and second-type scribe lines enabling placement of TEGs, alignment marks or other accessories, and a placement pattern is set so that a unit cell which can be exposed in a single shot comprises one second-type scribe line. By this means, the area occupied by scribe lines can be reduced. Further, by decreasing the number of placement of semiconductor chips constituting a unit cell, and by cutting substantially along the center line of second-type scribe lines, the shapes of scribe lines on the periphery of semiconductor chips can be changed, so that the position in the unit cell can be determined.

5 Claims, 9 Drawing Sheets

WAFER, SEMICONDUCTOR CHIP, AND SEMICONDUCTOR DEVICE

BACKGROUND OF THE INVENTION

1. Field of the Invention

This invention relates to a semiconductor chip and semiconductor device manufacturing method which facilitates defect inspection, and a wafer for obtaining such a semiconductor chip.

2. Description of the Related Art

In order to achieve lower costs for semiconductor chips, it is important that the number of semiconductor chips obtained from a single wafer be increased. As shown in FIG. 10, wafers generally comprise a plurality of semiconductor chips 3 arranged in a matrix, and scribe lines 9 of a prescribed width provided between the individual semiconductor chips 3. A dicing system or similar is used to cut the wafer 1 along the scribe lines 9, to divide the wafer into individual semiconductor chips 3.

A TEG (Test Element Group) comprising check transistors is formed on the wafer 1; this TEG is used to judge the quality of semiconductor chips 3 at the wafer stage. However, if a TEG is formed within a semiconductor chip 3, the area of the semiconductor chip 3 is increased, and so normally TEGs are formed on the above-described scribe lines 9. Also, alignment marks are necessary for mask positioning in order to manufacture semiconductor chips 3; such alignment marks are also formed on the above scribe lines 9. Consequently the scribe lines 9 must be made sufficiently wide to enable placement of both TEGs and alignment marks, and so there is a problem that as the widths of scribe lines 9 are increased, the number of semiconductor chips 3 which can be formed in a single wafer 1 is decreased.

Hence there have been various proposals to obtain as many semiconductor chips 3 as possible from a single wafer 1. For example, in Japanese Unexamined Patent Application Publication No. 2003-258049, pages 3 to 5, FIG. 2, Nakahara et al., a method of changing the width of scribe lines in the vertical direction and horizontal direction is disclosed. According to Nakahara et al., because in LCD drivers the electrodes corresponding to a row of pixels in the horizontal direction or in the vertical direction of an LCD are arranged in a row in the vertical direction or in the horizontal direction, semiconductor chips have long and narrow rectangular shapes, and consequently if scribe line widths are made the same in the width direction and in the length direction of the semiconductor chips, the area fraction occupied by scribe lines in the width direction increases, so that the area of the wafer that is wasted is increased; in order to resolve this problem, a first dividing extending region in the width direction is made wider than a second dividing region extending in the length direction, and consequently the number of semiconductor chips obtained is increased.

It has now been discovered that by using the above method, compared with a method of making scribe lines wider in both the vertical direction and the horizontal direction, the number of semiconductor chips obtained from a single wafer can be increased; but when the shape of semiconductor chips is nearly square, the area occupied by scribe lines in one direction (the above-described first dividing area) is increased, and the number of semiconductor chips obtained cannot be increased so much.

In structures of the above related art, the widths of scribe lines adjacent to the upper, lower, left and right edges of each semiconductor chip are either equal, or the scribe lines adjacent to each of the upper and lower edges or to the left and right edges are of equal width, so that the external view of each semiconductor chip is the same, and it is not possible to determine to which portion of a mask pattern a prescribed semiconductor chip corresponds, or in what position of the wafer the semiconductor chip has been placed; and there is the problem that when a defect is detected in inspections, semiconductor chip placement information cannot be used to check for mask pattern faults, nor can other defect analysis be performed rapidly.

SUMMARY OF THE INVENTION

In an aspect of the inventions, there is provided a wafer comprising a plurality of scribe lines and semiconductor chips each of which is formed in an area defined by the plurality of scribe lines. The plurality of scribe lines comprises a plurality of scribe lines extending in a first direction, including scribe lines of different widths, and a plurality of scribe lines extending in a second direction different from the first direction, including scribe lines of different widths. The scribe lines of different widths extending in the first and second direction ensure the reduction in the area of the scribe lines.

For example, the scribe lines provided on a wafer for division into a plurality of semiconductor chips arranged in a matrix comprise, in both placement directions (the vertical direction and the horizontal direction), first-type scribe lines, of the minimum width enabling cutting using dicing, laser machining, anisotropic etching, or other means, and scribe lines of a plurality of other widths, comprising second-type scribe lines and third-type scribe lines, with line widths larger than those of first-type scribe lines so as to enable placement of TEGs comprising check transistors, alignment marks, and similar. A scribe line placement pattern is set preferably such that, within a region which can be exposed in a single shot (a unit cell), one second-type scribe line or third-type scribe line in both the vertical direction and in the horizontal direction is comprised. By this means, compared with a configuration employing only thick scribe lines, the area occupied by scribe lines can be reduced, so that the number of semiconductor chips which can be obtained from a single wafer can be increased, and consequently semiconductor chip cost reduction can be achieved.

In another aspect of the invention, there is provided that a semiconductor chip, obtained by cutting a wafer along a plurality of scribe lines extending in a first direction and in a second direction. The plurality of scribe lines comprises first-type scribe lines and second-type scribe lines of width larger than that of the first-type scribe lines. The semiconductor chip is obtained by cutting, with a same width, substantially along the center lines of the plurality of scribe lines. The cutting substantially along the center lines of the plurality of scribe lines of different width allows identification of the chip position in the wafer, facilitating error inspection of the process.

For example, by reducing the number of semiconductor chip array lines comprised by the above unit cell (preferably to 3×3 or fewer array lines), and performing cutting substantially along the center lines of second-type or third-type scribe lines, the configuration of scribe lines remaining on the periphery of each semiconductor chip can be changed, and consequently the position within a unit cell of each semiconductor chip can be identified, the positions of mask pattern faults and similar can be identified, and defect analysis can be facilitated.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Figure 1:
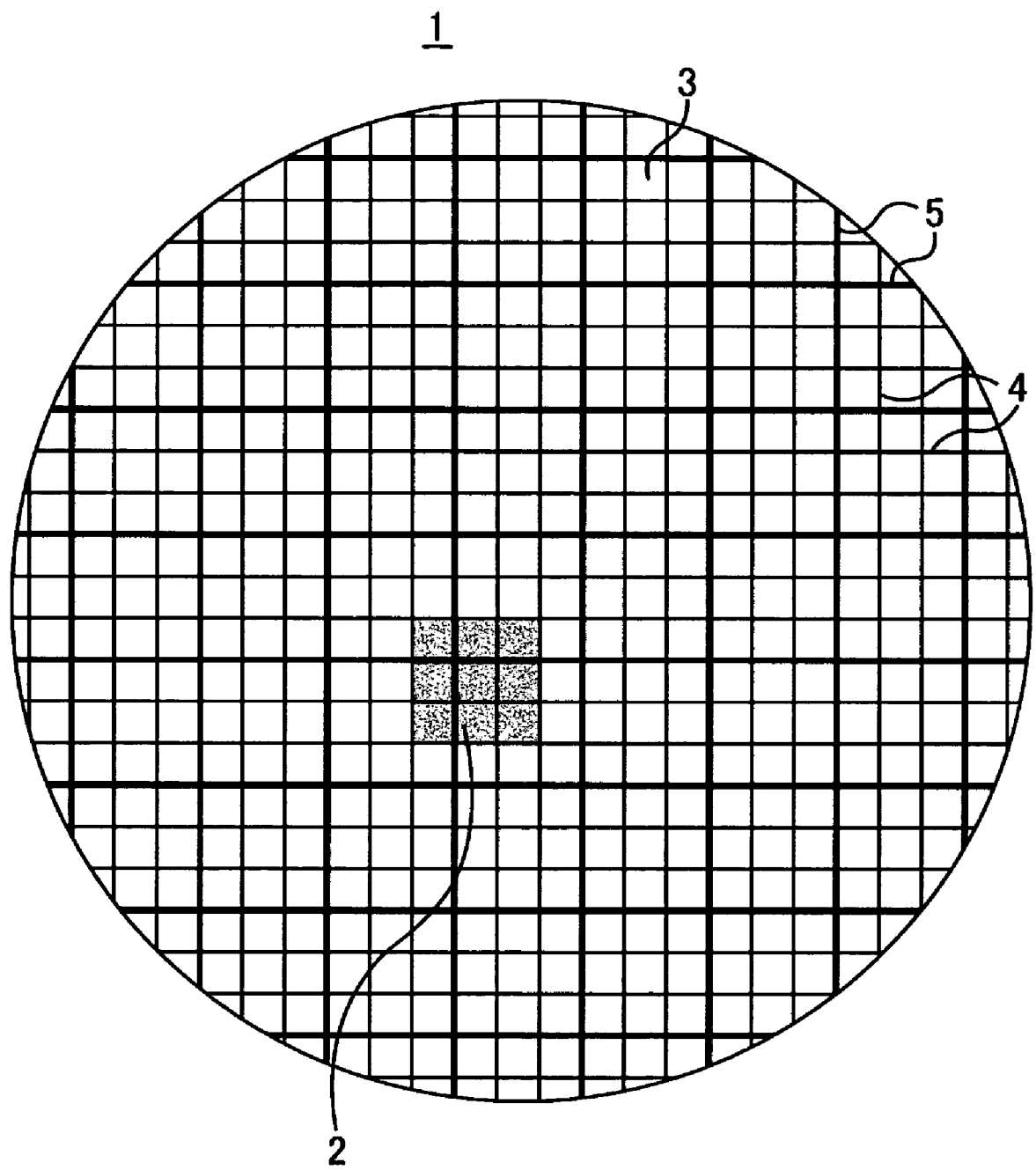
FIG. 1 is a plane view which schematically shows the configuration of a wafer in a first embodiment of the invention.

As indicated in the above related art, in order to increase the number of semiconductor chips which can be obtained from a single wafer, the area occupied by scribe lines is required to be reduced. In Nakahara et al., a method is disclosed in which scribe lines extending in the direction of long edges are made narrow, and scribe lines extending in the direction of short edges are made wide in a configuration in which rectangular semiconductor chips having long edges and short edges are arranged in an array. However, when this method is applied to semiconductor chips the shape of which is nearly square, the area occupied by scribe lines in one direction becomes large, and so the number of semiconductor chips which can be obtained from a single wafer cannot be increased so much.

Further, in a configuration in which all scribe lines are made the same width and in a configuration, as disclosed in Nakahara et al., in which the width of the scribe lines extending in one direction is different from the width of scribe lines extending in the other direction, the shapes of scribe lines on the periphery of each of the semiconductor chips are the same, so that the position of a prescribed semiconductor chip on the wafer cannot be identified, and the causes of the defect cannot be analyzed when the semiconductor chip is found to be defective.

When forming a resist pattern on a wafer, because lots of time is required to perform exposure separately for each semiconductor chip, a plurality of semiconductor chips are taken to be a single unit (a unit cell), and one time exposure is performed for each unit cell (so-called cell projection or block exposure). Among defects in semiconductor chips, those defects which occur in the same semiconductor chips position in different unit cells are often caused by mask pattern faults. Hence when semiconductor chips are found to be defective, if the positions in unit cells in which the semiconductor chips were located are known, then the locations of pattern defects can be determined, and fault analysis can be performed rapidly.

Hence in this invention, the scribe lines provided on a wafer for division comprise, in both semiconductor chip placement directions (the vertical direction and the horizontal direction, for example), first-type scribe lines of the minimum width enabling cutting using dicing, laser machining, anisotropic etching, or other means, and second-type scribe lines or third-type scribe lines, in which accessories, such as TEGs and alignment marks, can be placed. A scribe line placement pattern is set such that only one second-type scribe line and/or only one third-type scribe line is comprised within one unit cell. By this means, the area occupied by scribe lines can be reduced without impeding alignment or semiconductor chip inspections. Also, although the area occupied by scribe lines is increased somewhat, by reducing the number of semiconductor chips constituting a part of the above unit cell (preferable with an array of 3×3 or fewer), and by performing cutting substantially along the center lines of second-type or third-type scribe lines, the shapes of scribe lines on the periphery of each of the semiconductor chips can be changed, so that the position in a unit cell in which a prescribed semiconductor was placed can be determined from the external appearance of the chips. By this means, when a semiconductor chip is found to be defective, mask pattern faults can be easily detected, and fault analysis can be performed rapidly.

Embodiment 1

Figure 2:
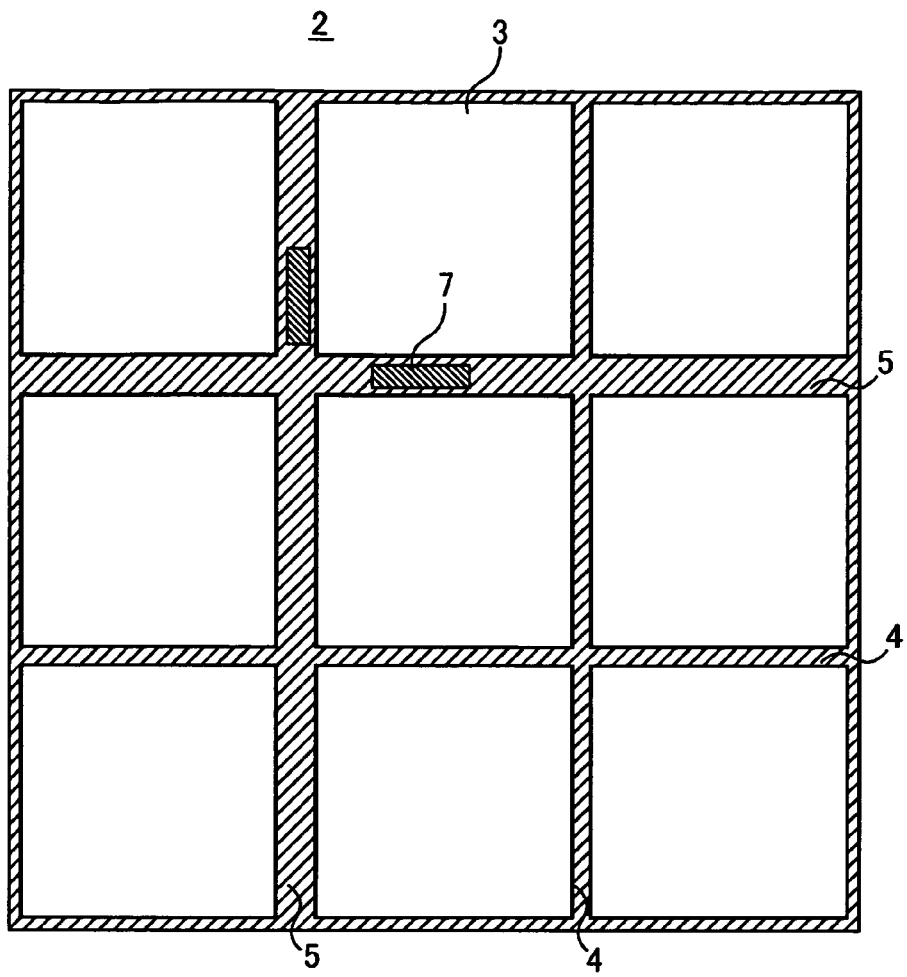
FIG. 2 is a plane view which schematically shows the configuration of a wafer unit cell in the first embodiment of the invention.
Figure 3:
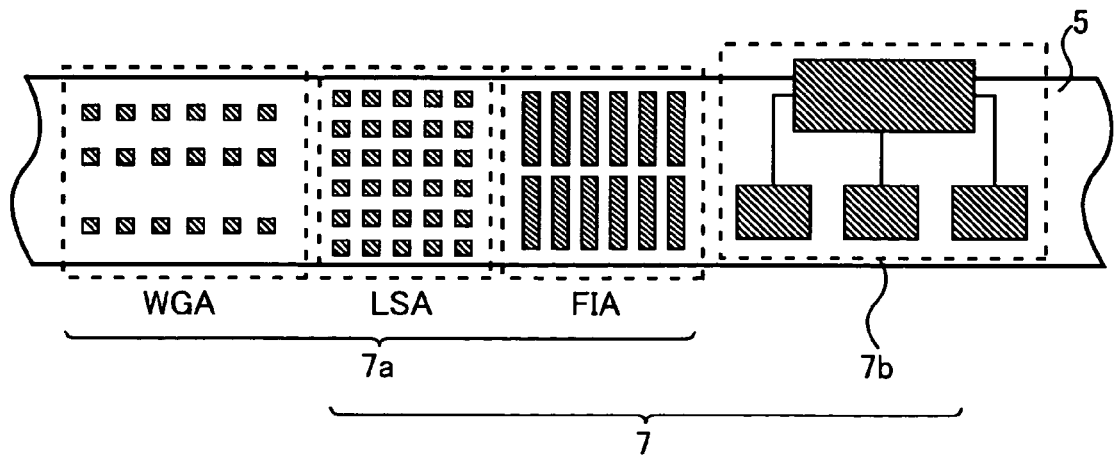
FIG. 3 is a plane view which shows an example of the configuration of accessories placed in second-type scribe lines in the first embodiment of the invention.
Figure 4:
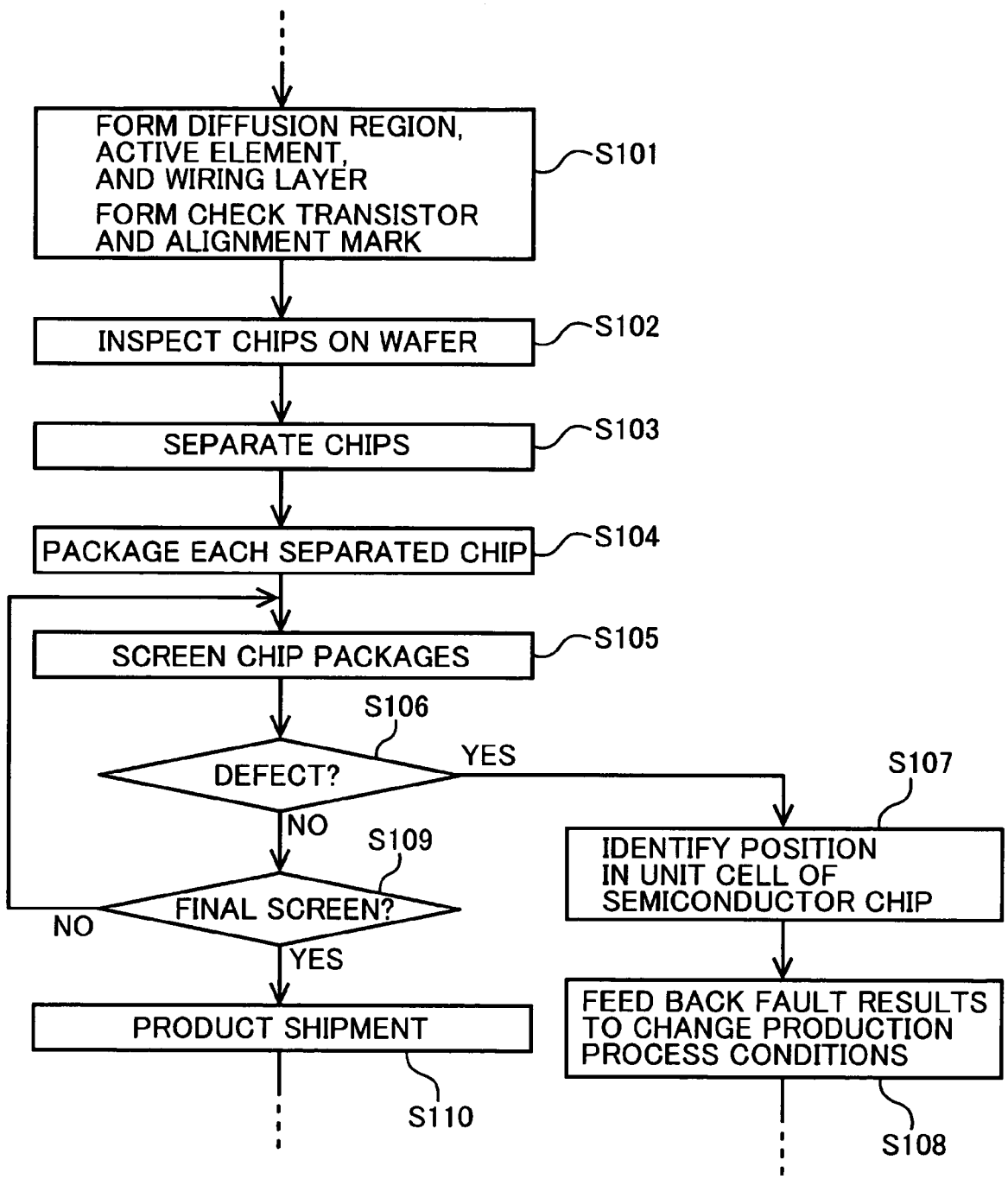
FIG. 4 is a flowchart describing a portion of the wafer manufacturing process of the first embodiment of the invention.
Figure 5A:
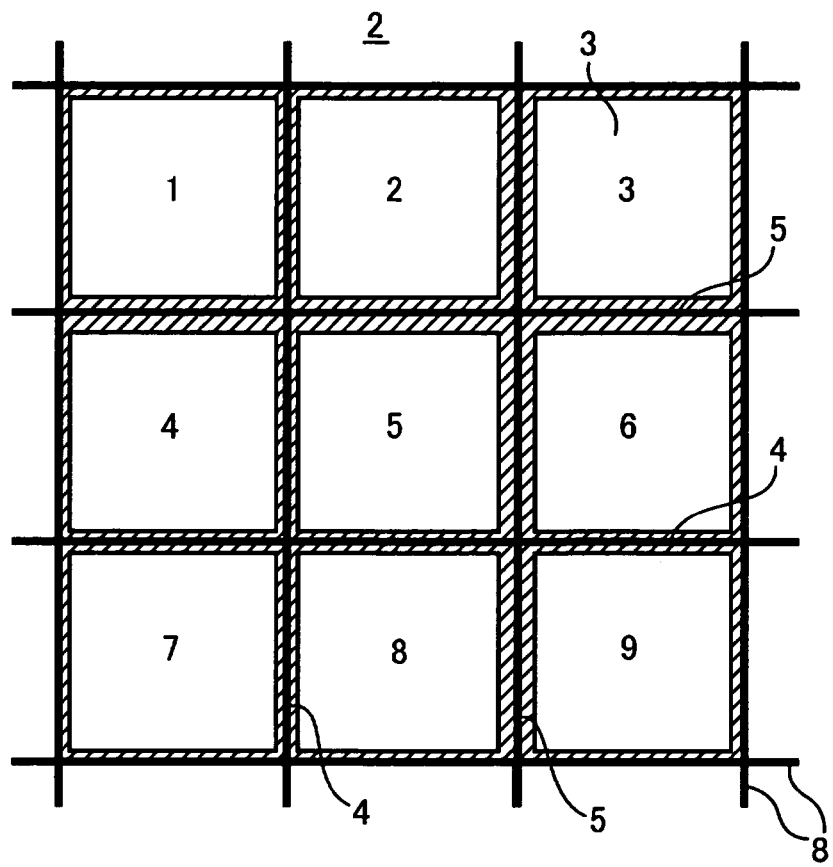
FIG. 5A is a plane view indicating the cutting position (when cutting along one center line) in scribe lines of the wafer of the first embodiment of the invention.
Figure 5B:
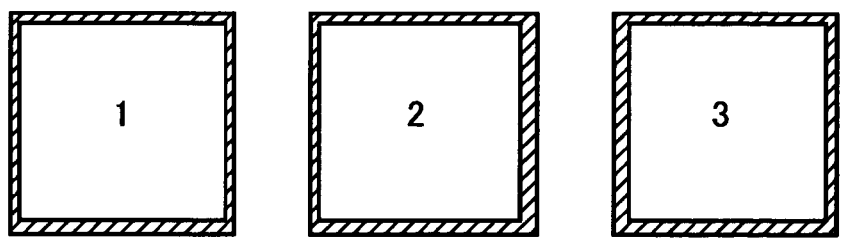
FIG. 5B is a schematic figure showing each of the semiconductor chips after cutting.
Figure 5B:
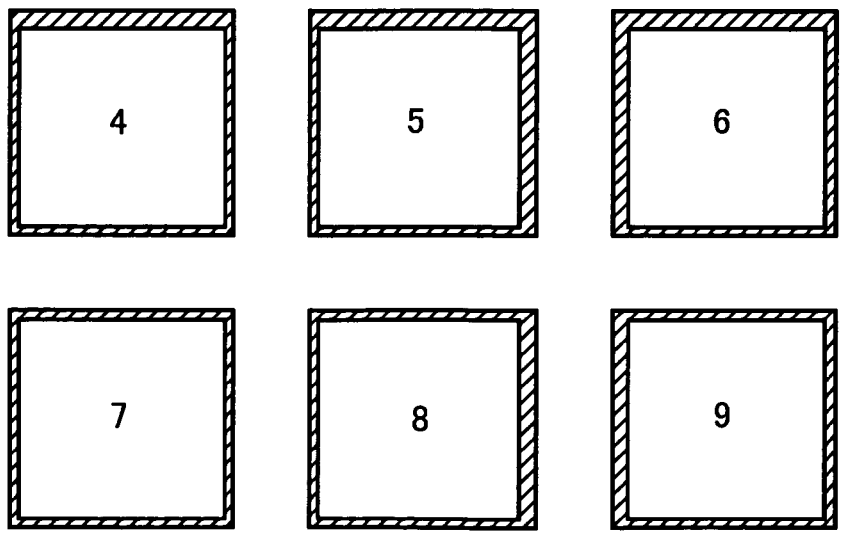
Figure 6A:
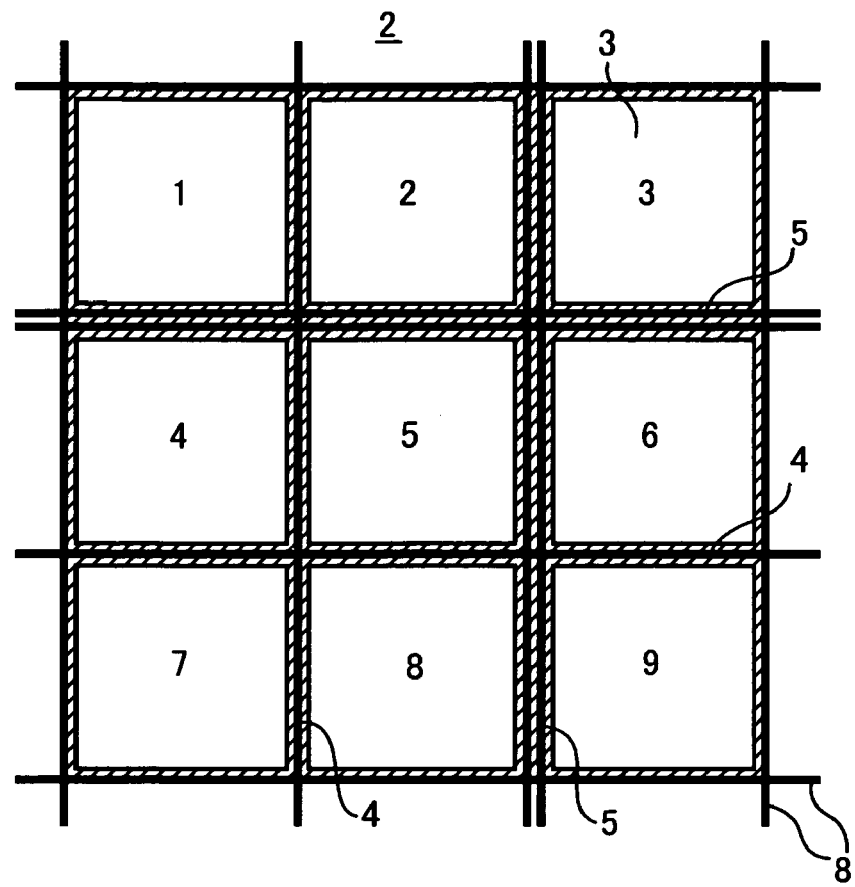
FIG. 6A is a plane view indicating the cutting position (when cutting along two lines on both sides) in scribe lines of the wafer of the first embodiment of the invention.
Figure 6B:
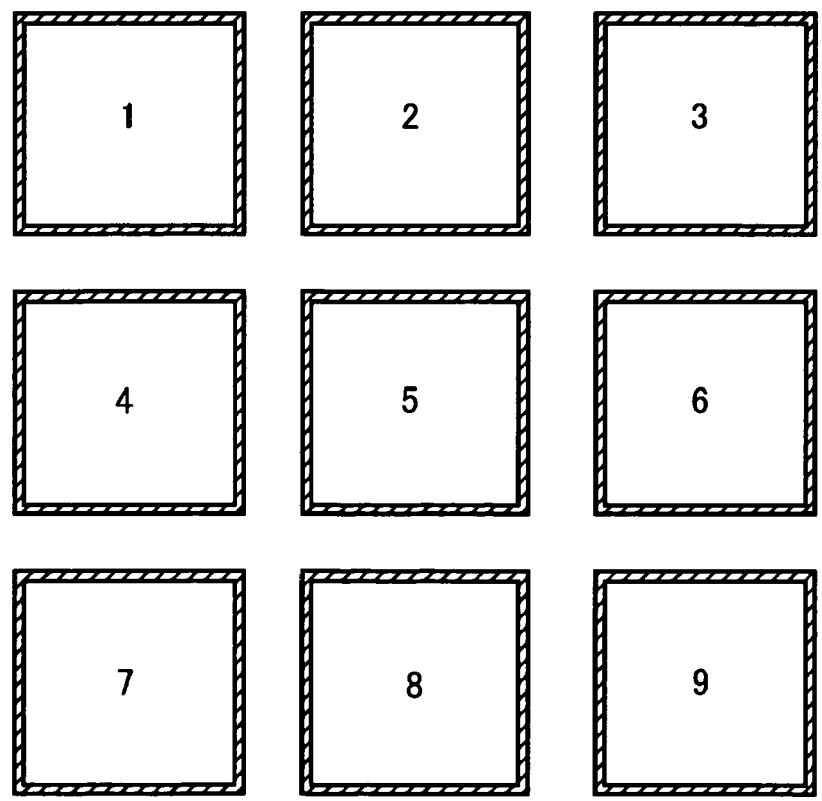
FIG. 6B is a schematic figure showing each of the semiconductor chips after cutting.

In order to explain the above aspect of the invention in further detail, a semiconductor device and manufacturing method therefor of a first embodiment of the invention are explained, referring to FIG. 1 through FIG. 6B. FIG. 1 is a plane view which schematically shows the configuration of a wafer in the first embodiment of the invention, and FIG. 2 shows in enlargement an area (unit cell) which can be exposed in a single shot. FIG. 3 shows an example of the configuration of accessories placed in second-type scribe lines, and FIG. 4 is a flowchart describing a portion of the semiconductor device manufacturing process. FIG. 5 and FIG. 6B are plane views indicating the cutting positions in scribe lines.

As shown in FIG. 1 and FIG. 2, the wafer 1 of this embodiment comprises a plurality of semiconductor chips 3 arranged in a matrix, and scribe lines provided so as to divide the wafer into the individual semiconductor chips 3; these scribe lines comprise, in both a first direction (for example, the vertical direction in the figure) and in a second direction (for example, the horizontal direction in the figure), first-type scribe lines 4 of the minimum width enabling cutting using dicing, laser machining, anisotropic etching, or other means, and second-type scribe lines 5 of a width enabling placement of TEGs comprising check transistors, alignment marks, or other accessories 7. The width of the second-type scribe lines 5 is larger than the width of the first-type scribe lines 4. The scribe line placement pattern is set such that, within an area which can be exposed in a single shot (a unit cell 2), one second-type scribe line 5 is comprised in both the first direction and in the second direction.

The configuration of a unit cell 2 (specifically, the number of arrayed semiconductor chips 3 and the number of scribe lines) is not limited to that of the figure, but may be determined according to the dimensions of the semiconductor chips 3 and the size of the area which can be exposed in a single shot. However, the greater the number of first-type scribe lines 4 is provided between second-type scribe lines 5, the more the area occupied by scribe lines can be decreased, hence the greater the number of semiconductor chips 3 can be obtained from a single wafer. Although the number of semiconductor chips 3 which can be obtained is decreased somewhat, if the number of arrayed semiconductor chips contained a unit cell is decreased (preferably to 3×3 or fewer), the semiconductor chips 3 positions within the cell can be determined, for reasons explained below. Hence the configuration of unit cells 2 should be designed according to whether to give priority to the number of semiconductor chips 3 obtained, or to the identification of the position in unit cells 2 of semiconductor chips 3.

The width of first-type scribe lines 4 needs only to be wide enough to enable cutting without damage to the semiconductor chips 3 on either side of the first-type scribe lines 4.

The width of second-type scribe lines 5 needs only to be wide to enable placement of TEGs, comprising check transistors, of alignment marks, or of other accessories 7; because check transistors are formed in substantially the same size as the transistors formed within the semiconductor chips 3, and alignment marks are provided according to the performance of the exposure equipment, the width cannot be rigorously specified, but should at least be greater than the width of the first-type scribe lines 4.

In FIG. 2, an example of formation of two accessories 7 within a unit cell 2 is shown. Alternately, a single alignment mark 7a may for example be formed within a unit cell 2. The number and location of accessories 7, and the number, configuration and location of alignment marks 7a and check transistors 7b within accessories 7, can be set as appropriate.

Next, a method of manufacture of semiconductor chips 3 using a wafer 1 of the above configuration is explained, referring to the flowchart of FIG. 4.

First, in step S101, well-known techniques, such as for example photolithographic techniques, etching techniques, impurity implantation techniques, and film deposition techniques, are used to form diffusion regions, active elements, insulating layers, wiring layers, and similar in chip formation regions of the wafer 1 demarcated by first-type scribe lines 4 and second-type scribe lines 5. The wafer 1 may be, for example, a silicon wafer, GaAs wafer, glass wafer, or similar. The check transistors 7b and other TEGs to confirm the quality of semiconductor chips 3 are formed in prescribed positions of the second-type scribe lines 5 under conditions similar to those in the chip formation regions, and in addition alignment marks 7a are formed in prescribed positions (for example, at the upper, lower, right or left edges of unit cells 2) of second-type scribe lines 5 using a wiring layer or similar. Using these alignment marks 7a, mask positioning is performed, and the semiconductor chips 3 are formed.

Next, in step S102, semiconductor chips 3 on the wafer are inspected (for functions and electrical characteristics).

Next, in step S103, cutting is performed on the first-type scribe lines 4 and second-type scribe lines 5, to separate the individual semiconductor chips 3. For example, when cutting using a dicing system, a thin disc-shaped blade rotating at high speed is moved along the scribe lines to separate the individual semiconductor chips 3. Or, a laser machining system may be used to irradiate the wafer with laser light and perform cutting along scribe lines; or, when using anisotropic etching, a slit-shape aperture is formed in scribe lines, a resist pattern is formed, and the resist pattern is used as a mask to perform anisotropic etching. In this case, because the width of the first-type scribe lines 4 is close to the cutting line (cutting area) width, cutting need only be performed along the cutting area 8 substantially at the center of the first-type scribe lines 4; but with respect to the second-type scribe lines 5, as shown in FIG. 5A, cutting may be performed along the cutting area 8 substantially at the center of the second-type scribe lines 5, or cutting may be performed along each of two cutting areas 8 on both sides of the second-type scribe lines, as in FIG. 6A.

When chip division is performed by the method of FIG. 6A, because, as shown in FIG. 6B, there remains a scribe line of nearly the same width on the periphery of each of the semiconductor chips 3 (here, to facilitate understanding, scribe lines are left as large lines; but by setting the first-type scribe lines 4 to the minimum width enabling cutting, and by setting the second-type scribe lines 5 such that the cutting areas on both edges result in the minimum residue after cutting, there is hardly any remainder of scribe lines on the periphery of semiconductor chips 3), so that the individual semiconductor chips 3 cannot be distinguished, and so the positions in a unit cell 2 of the individual semiconductor chips 3 cannot be determined. However, in the case of chip division by the method of FIG. 5A, as shown in FIG. 5B, the shapes of scribe lines remaining on the periphery of each of the semiconductor chips 3 differ (for example, in the first semiconductor chip 3, there is a greater amount of material remaining from the second-type scribe line 5 on the bottom side, and in the second semiconductor chip 3, there is a greater amount of material remaining from second-type scribe lines 5 on the right side and bottom sides), so that judging from the external appearance of the semiconductor chips 3, it is possible to easily identify the position in a unit cell 2 of the semiconductor chip 3.

In this embodiment, either method may be used for cutting; but when the external dimensions of the semiconductor chips 3 are stipulated, the method of FIG. 6A may be used to form semiconductor chips of substantially the same dimensions, and when the placement location in unit cells 2 of semiconductor chips 3 is required to be identified, the method of FIG. 5 may be used to form semiconductor chips 3 with different remaining scribe line shapes.

Next, in step S104 each of the separated semiconductor chips 3 is mounted in a package or similar, and wire bonding, BGA (ball grid array) or another method is used to connect pads on the semiconductor chip 3 to package terminals.

Then, in step S105, screening after package assembly is performed. In step S106, chips are inspected for defects; at this time, there are cases in which a specific test results in numerous defects. There are also cases in which defects occur in the same mode after product shipment. The causes of such defects include not only problems arising from assembly processes, but problems in chip production processes. In order to narrow down possible causes, if it is possible to identify the positions of chips on a wafer when investigating chip production processes, identification of the primary cause becomes easy. However, because in the above related art the shapes of all semiconductor chips are substantially the same, even if a defect is found in step S106, it has not been possible to identify the position in the unit cell 2 of the semiconductor chip 3; but in this embodiment, by performing cutting according to the method of FIG. 5A, the position in the unit cell 2 of the semiconductor chip 3 can be determined from the shape of the semiconductor chip 3 (that is, from the shape of scribe lines remaining on the periphery of the semiconductor chip 3) in step S107. Hence in step S108, for example, if variations in specific characteristics within a wafer and shot dependence are observed in the wafer inspection, it is possible to confirm a causal relation between this and the variations in characteristics. Also, even if anomaly patterns in chips caused by mask faults, foreign matter and the like accelerates due to stress (heat, bias testing or similar) after assembly and defects are developed, fault analysis can be performed rapidly and the fault analysis results are fed back to change production process conditions, repair masks, or perform cleaning or other processing.

When in step S106 a chip is found to be non-defective, the product shipment process can immediately begin; but there are also cases in which measurement of changes over time in the reliability assessment and screening process to reliably exclude defective chips need to be repeated. Hence in step S109, it is determined whether the shorting of step S105 is the final sorting for product shipment, and if not the final sorting, in step S105 repeated reliability assessments are performed after a prescribed amount of time has elapsed, and screening is repeated. If judged to be the final screening, the product shipment process of step S110 is performed.

Thus in this embodiment, rather than making all the scribe lines of a width enabling placement of accessories, or making only scribe lines in the vertical direction or in the horizontal direction of a width enabling placement of accessories 7, the scribe lines, in both the vertical and the horizontal directions, comprise both first-type scribe lines 4 of the minimum width enabling cutting and second-type scribe lines 5 of a width enabling placement of accessories 7, and the scribe line placement pattern is set such that within one unit cell 2, one second-type scribe line 5 in both the horizontal direction and in the vertical direction is comprised, so that the area occupied by scribe lines is made as small as possible and the number of semiconductor chips 3 which can be formed on one wafer can be increased. In particular, by reducing the number of semiconductor chips in an array comprised in a unit cell 2 (preferably to 3×3 or fewer), and by cutting along the center line of second-type scribe lines 5, the configuration of scribe lines remaining on the periphery of semiconductor chips 3 can be changed, and the position in a unit cell of each semiconductor chip 3 can be determined from the external appearance, so that analysis of the cause of defects can easily be performed.

Next, the effect in reducing the area occupied by scribe lines through this invention is verified using specific figures for actual semiconductor devices. For example, if an area which can be exposed in one shot is 20 mm×20 mm, and the external dimensions of a semiconductor chip are 2 mm×2 mm, then in the configuration of the related art in which the width of all scribe lines is 100 μm, the number of semiconductor chips 3 (x) per edge of a unit cell 2 must satisfy the relation $$(2x+(0.05\times 2)+0.1\times (x-1))\leq 20 \text{ (mm)} \quad (1)$$

and the maximum number of chips per edge is 9.

Hence if 9 is substituted for x in equation (1), then the length of one side of a unit cell 2 becomes 18.9 mm, and the effective rate of use of chips is $(2\times 9)^2/(18.9)^2=90.7\%$.

On the other hand, if one second-type scribe line 5 of width 100 μm is provided in each of the vertical and horizontal directions in each unit cell 2, and the other scribe lines are first-type scribe lines 4 of width 10 μm, then if the number of chips per edge is 9 as in the configuration of the related art, then the length of one side is $$(2\times 9+(0.005\times 2)+0.01\times (x-2)+0.1)=18.18 \text{ (mm)}$$

and the effective rate of use of chips is $(2\times 9)^2/(18.18)^2=98.0\%$.

From the above results, the effective area difference is $(18.9)^2-(18.18)^2=26.70$ (mm$^2$), so that when a chip size of the related art is assumed, the number of semiconductor chips 3 can be increased by 6.8 chips.

Embodiment 2

Figure 7:
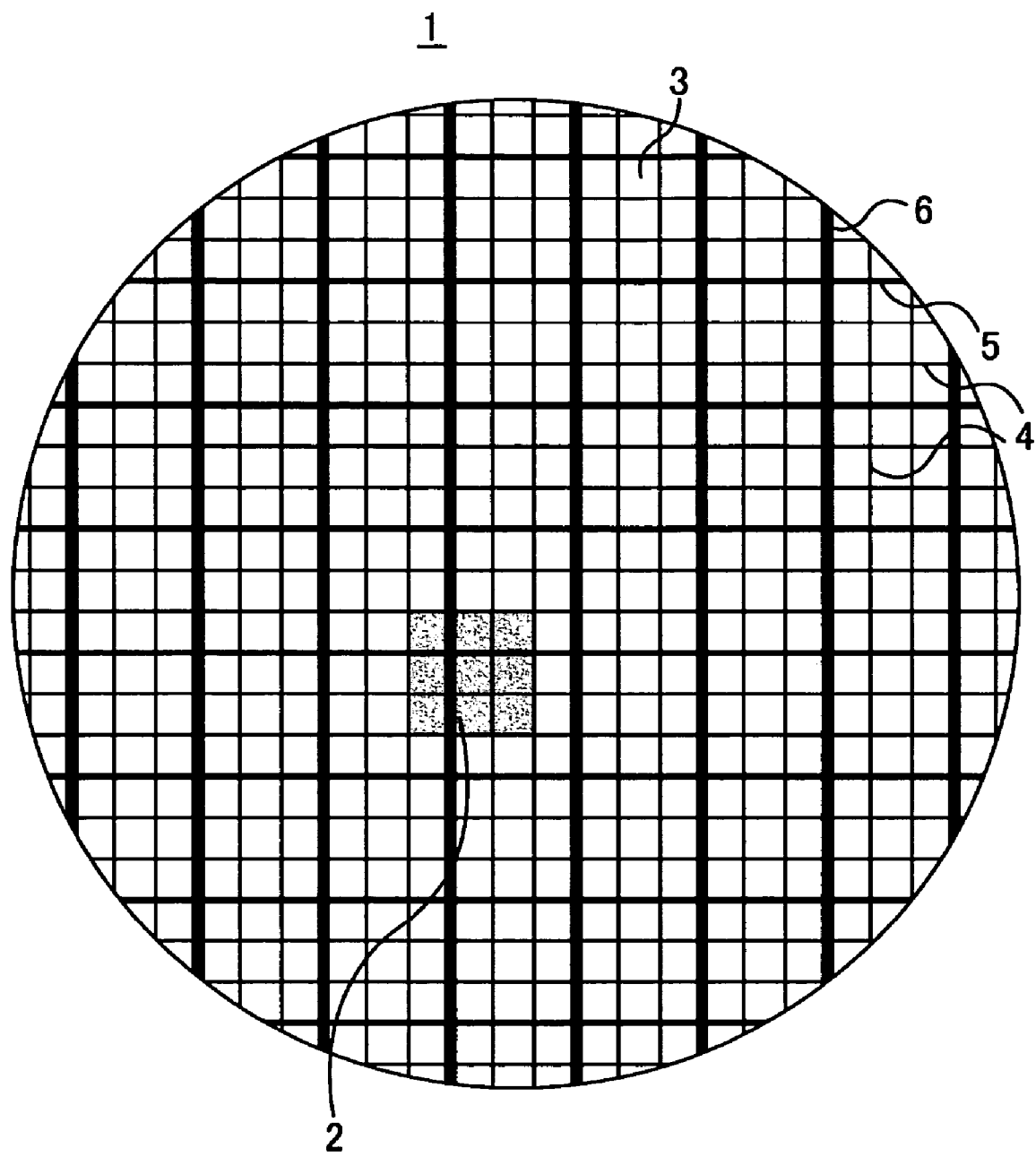
FIG. 7 is a plane view which schematically shows the configuration of a wafer in a second embodiment of the invention.
Figure 8A:
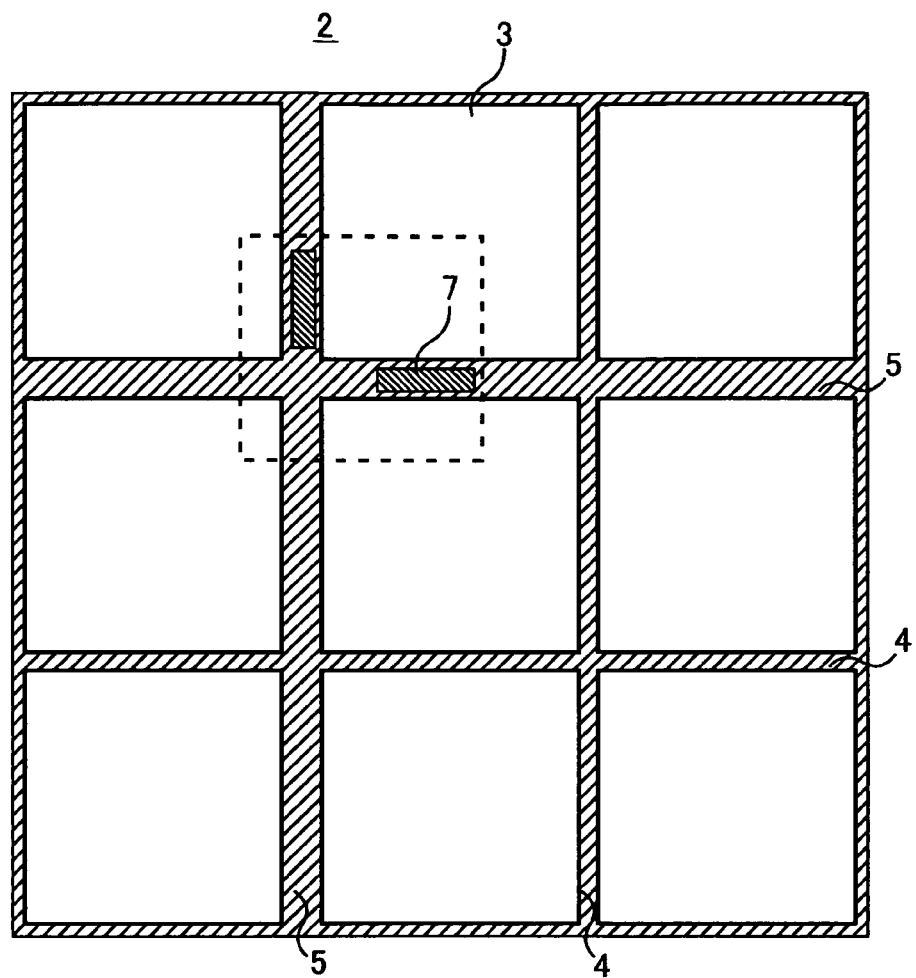
FIG. 8A is a plane view which shows schematically the configuration of a unit cell in the wafer of the second embodiment of the invention.
Figure 8B:
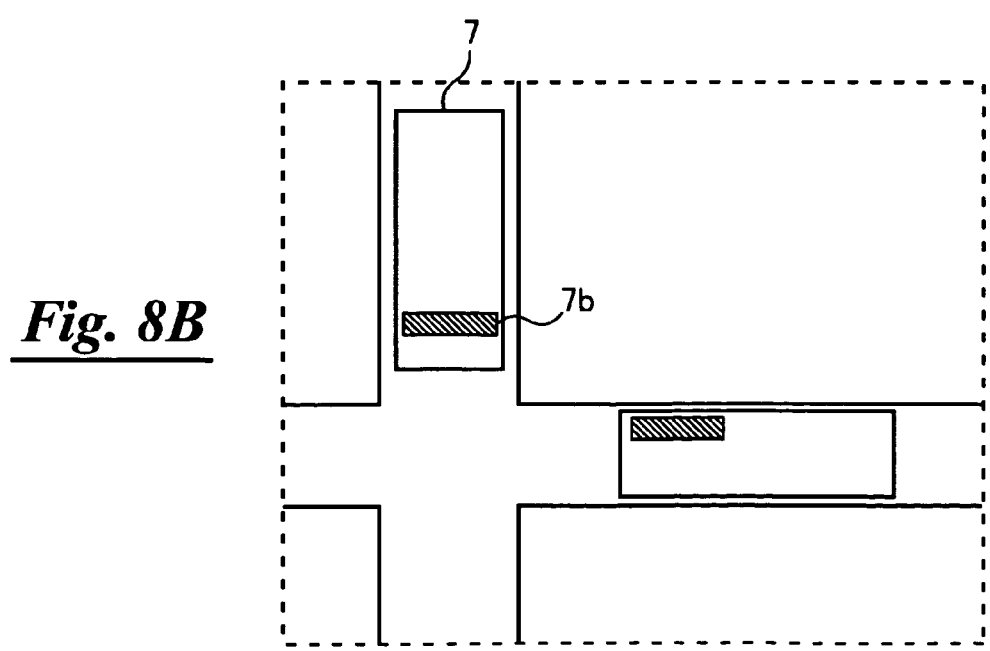
FIG. 8B shows in enlargement the principal portions of the wafer.

Next, semiconductor devices and the manufacturing method of a second embodiment of the invention are explained, referring to FIG. 7 and FIG. 8. FIG. 7 is a plane view which schematically shows the configuration of a wafer in the second embodiment; FIG. 8 is an enlarged view of a unit cell.

In the above-described first embodiment, there are two types of scribe lines in both the vertical direction and in the horizontal direction, which are narrow scribe with the minimum width to enable cutting, and wide scribe lines enabling placement of accessories 7, such as TEGs and alignment marks. Check transistors 7b to confirm operation of the transistors comprised within the semiconductor chips 3 must be formed with the same size and orientation as those in the semiconductor chips 3, so that when check transistors 7b have a long narrow shape, the width of the scribe lines changes according to the check transistor orientation.

In this embodiment, as shown in FIG. 7 and FIG. 8, when check transistors 7b have a rectangular shape which is long in the horizontal direction in the figure, scribe lines extending in the length direction (the horizontal direction in the figures) of the check transistors 7b comprise first-type scribe lines 4, of the minimum width enabling cutting, and second-type scribe lines 5 (this name is merely for convenience, and the width may be different from the width of second-type scribe lines in the first embodiment), of a width enabling placement of check transistors 7b with the length direction being in the direction of extension of the scribe line, and scribe lines extending in the direction orthogonal to the length direction of check transistors 7b (the vertical direction in the figure) comprise the above first-type scribe lines 4, and third-type scribe lines 6, of a width enabling placement of check transistors 7b with the length direction being orthogonal to the direction of extension of the scribe line. That is, in this embodiment the scribe lines comprise three types of scribe lines, which are first-type scribe lines 4; second-type scribe lines 5, of width greater than that of the first-type scribe lines 4; and third-type scribe lines 6, of width greater than that of the second-type scribe lines 5.

By means of this configuration, even when check transistors 7b have a long and narrow shape, at least the width of the scribe lines extending in the transistor length direction (here, the second-type scribe lines 5) can be made as small as possible, and so the number of semiconductor chips 3 which can be formed on a single wafer 1 can be increased to the extent possible. And similarly to the first embodiment, by reducing the number of arrayed semiconductor chips 3 in a unit cell 2 (preferably to 3×3 or fewer), and cutting substantially along the center lines of the second-type scribe lines 5 and third-type scribe lines 6, the positions in unit cells 2 of each of the semiconductor chips 3 can be determined from the shapes of scribe lines remaining on the periphery of the semiconductor chips 3.

Embodiment 3

Figure 9:
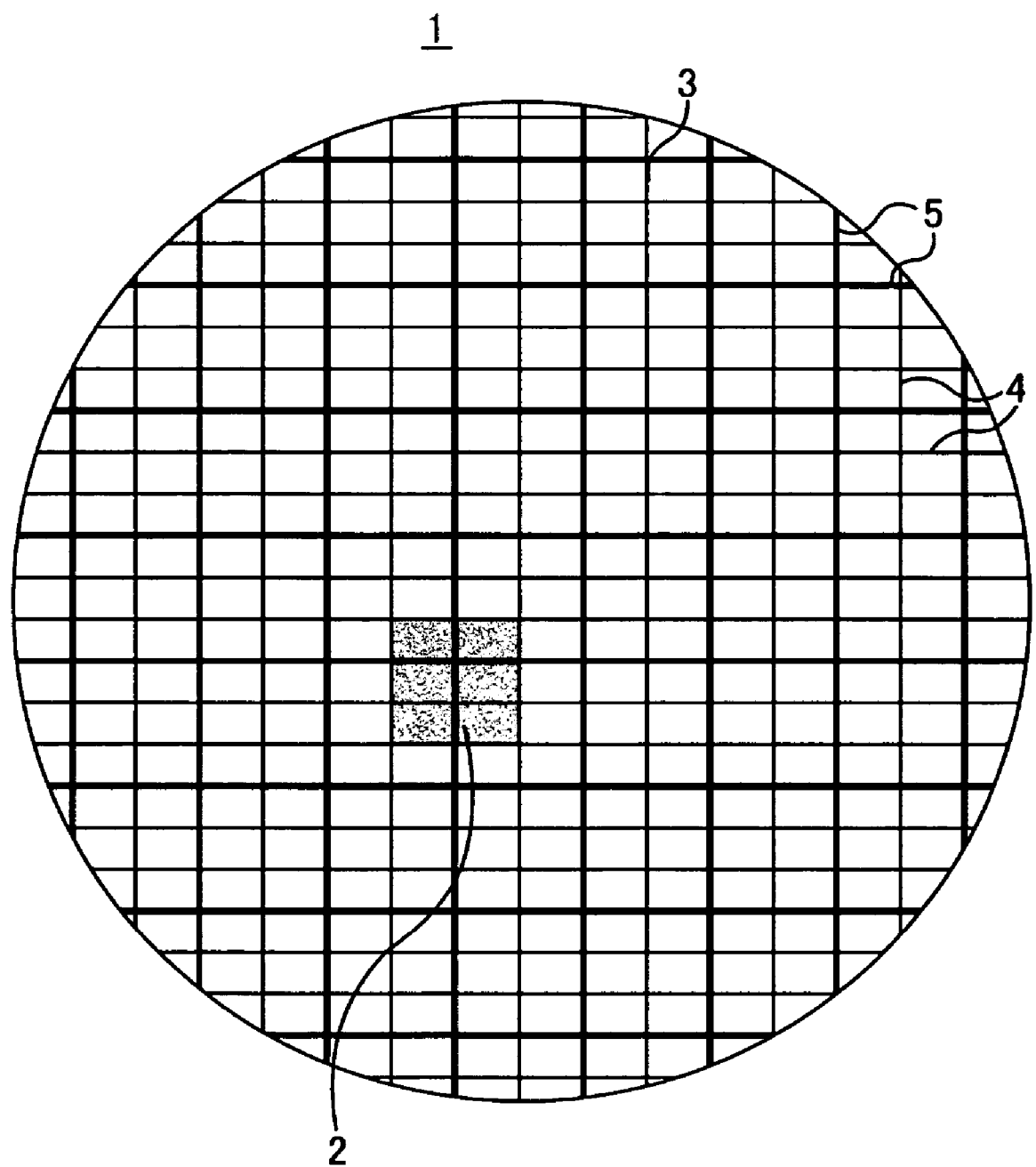
FIG. 9 is a plane view which shows schematically the configuration of a wafer in a third embodiment of the invention; and, FIG. 10 is a plane view which shows schematically the configuration of a wafer of the related art.
Figure 10:
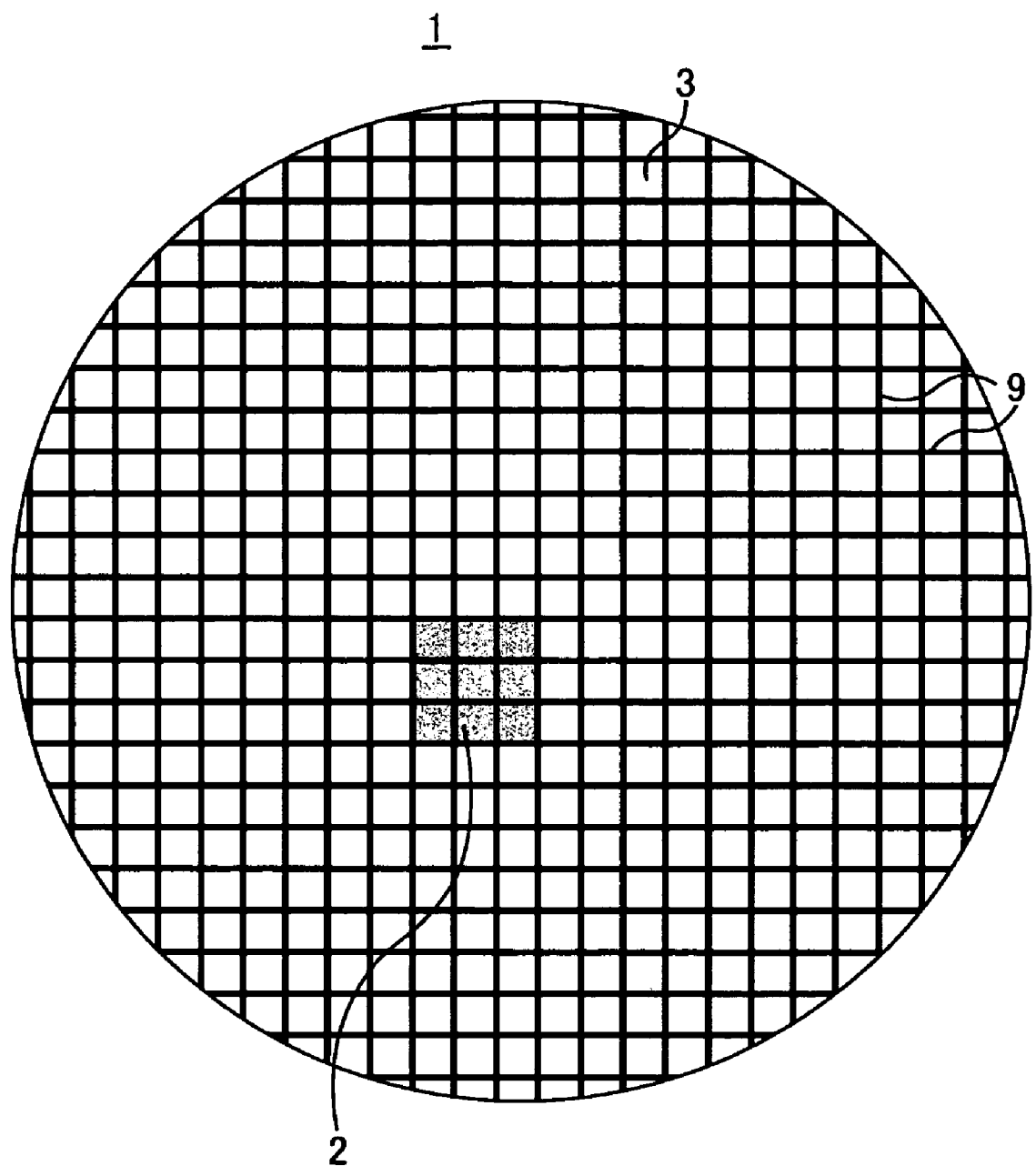

Next, semiconductor devices and the manufacturing method of a third embodiment of the invention are explained, referring to FIG. 9. FIG. 9 is a plane view which shows schematically the configuration of a wafer in the third embodiment.

In the above-described first and second embodiments, the semiconductor chips 3 were substantially square in shape, so that the number of semiconductor chips 3 comprising a unit cell 2 were made equal in the vertical direction and in the horizontal direction; but when semiconductor chips 3 are rectangles, if the number of semiconductor chips 3 constituting a part of a unit cell 2 is made the same in the vertical direction and in the horizontal direction, the unit cell 2 also becomes a rectangle, and as a result it may not be possible to expose the entire unit cell 2 in a single shot.

In this embodiment, rather than making the number of semiconductor chips 3 in the vertical direction and in the horizontal direction equal, the configuration of the unit cell 2 (the numbers of semiconductor chips 3 in the vertical and in the horizontal directions) is set such that the unit cell 2 is substantially square in shape, and in addition, the layout pattern of first-type scribe lines 4 and second-type scribe lines 5 is set according to the configuration of the unit cell 2. For example, as shown in FIG. 9, when semiconductor chips are long in the horizontal direction, the number of semiconductor chips 3 in the horizontal direction is reduced to configure the unit cell 2.

By thus setting the array numbers of semiconductor chips 3 such that the unit cell 2 is substantially square in shape, the entirety of a unit cell 2 can be exposed in a single shot. In this case also, by employing a configuration such that a single unit cell 2 comprises only one second-type scribe line 5 in each of the vertical and the horizontal directions, the number of semiconductor chips 3 obtained can be increased, and by reducing the number of semiconductor chips 3 contained in the unit cell 2 (preferably to 3×3 or fewer), and by cutting substantially along the center lines of the second-type scribe lines 5, the position in a unit cell 2 of each semiconductor chip 3 can be determined from the shapes of scribe lines remaining on the periphery of the semiconductor chip 3. In the configuration of FIG. 9, similarly to the second embodiment, the scribe lines in which accessories 7 are placed may comprise two types of scribe lines with different widths.

In each of the above embodiments, configurations are adopted in which one second-type scribe line 5 or third-type scribe line 6 in each of the vertical and horizontal directions is comprised within an area which can be exposed in a single shot (a unit cell 2); however, this invention is not limited to the above embodiments, and a unit cell 2 may comprise a plurality of second-type scribe lines 5 or of third-type scribe lines 6 (that is, such that there are a plurality of the minimum unit of repetition placed within one unit cell). In the case of such a configuration, the area occupied by scribe lines is increased somewhat, but numerous TEGs can be placed, and there are advantageous results when more accurate inspections are to be performed.

It is apparent that the present invention is not limited to the above embodiment, that may be modified and changed without departing from the scope and spirit of the invention.

What is claimed is:

1. A wafer comprising:
a plurality of scribe lines comprising:
   a plurality of first scribe lines extending in a first direction having a first width;
   a plurality of second scribe lines extending in the first direction having a second width greater than the first width;
   a plurality of third scribe lines extending in a second direction different from the first direction having the first width;
   a plurality of fourth scribe lines extending in the second direction having the second width; and
   semiconductor chips each of which is formed in an area defined by the plurality of scribe lines;
wherein:
the semiconductor chips are arranged in a plurality of unit cells, each unit cell containing only one of the second scribe lines and only one of the fourth scribe lines, wherein the relative position of each semiconductor chip within the unit cell is uniquely defined by the shapes of the scribe lines on the periphery of each semiconductor chip,
the second scribe lines comprise at least either a first alignment mark or a first TEG (Test Element Group) comprising at least one first check transistor and the fourth scribe lines comprise at least either a second alignment mark or a second TEG (Test Element Group) comprising at least one second check transistor,
the at least one first transistor has a rectangular shape and is arranged in a way such that the length direction of the first check transistor is substantially parallel to the first direction, and
the at least one second check transistor has a rectangular shape and is arranged in a way such that the longer side length direction of the second check transistor is orthogonal to the first direction.

2. A wafer comprising:
a plurality of scribe lines comprising:
   a plurality of first scribe lines extending in a first direction having a first width;
   a plurality of second scribe lines extending in the first direction having a second width greater than the first width;
   a plurality of third scribe lines extending in a second direction different from the first direction having the first width;
   a plurality of fourth scribe lines extending in the second direction having a third width greater than the second width; and
   semiconductor chips each of which is formed in an area defined by the plurality of scribe lines;
wherein:
the semiconductor chips are arranged in a plurality of unit cells, each unit cell containing only one of the second scribe lines and only one of the fourth scribe lines, whereby the relative position of each semiconductor chip within the unit cell is uniquely defined by the shapes of the scribe lines on the periphery of each semiconductor,
the second scribe lines comprise at least either a first alignment mark or a first TEG (Test Element Group) comprising at least one first check transistor and the fourth scribe lines comprise at least either a second alignment mark or a second TEG (Test Element Group) comprising at least one second check transistor,
the at least first transistor has a rectangular shape and is arranged in a way such that the length direction of the first check transistor is substantially parallel to the first direction, and
the second check transistor has a rectangular shape and is arranged in a way such that the longer side length direction of the second check transistor is orthogonal to the first direction.

3. A wafer comprising:

a plurality of scribe lines comprising:

a plurality of first scribe lines extending in a first direction having a first width;

a plurality of second scribe lines extending in the first direction having a second width greater than the first width;

a plurality of third scribe lines extending in a second direction different from the first direction having the first width; and a plurality of fourth scribe lines extending in the second direction having the second width; and semiconductor chips each of which is formed in an area defined by the plurality of scribe lines;

wherein:

each of the first scribe lines is located adjacent to one of the first scribe lines and one of the second scribe lines;

each of the second scribe lines is located adjacent to two of the second scribe lines;

each of the third scribe lines is located adjacent to one of the third scribe lines and one of fourth scribe lines;

each of the fourth scribe lines is located adjacent to two of the third scribe lines, the second scribe lines comprise at least either a first alignment mark or a first TEG (Test Element Group) comprising at least one first check transistor, the fourth scribe lines comprise at least either a second alignment mark or a second TEG (Test Element Group) comprising at least one second check transistor, the at least first transistor has a rectangular shape and is arranged in a way such that the length direction of the first check transistor is substantially parallel to the first direction, and the second check transistor has a rectangular shape and is arranged in a way such that the longer side length direction of the second check transistor is orthogonal to the first direction.

4. The wafer of claim 3, wherein the second width and the third width are same.

5. The wafer of claim 3, wherein the third width is greater than the second width.

* * * * *